(12) United States Patent
Kim et al.

(10) Patent No.: US 7,601,632 B2
(45) Date of Patent: Oct. 13, 2009

(54) METHOD OF FORMING A METAL LINE OF A SEMICONDUCTOR DEVICE

(75) Inventors: Eun Soo Kim, Icheon (KR); Cheol Mo Jeong, Kyeongki-do (KR); Seung Hee Hong, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 372 days.

(21) Appl. No.: 11/646,925

(22) Filed: Dec. 27, 2006

(65) Prior Publication Data
US 2008/0064204 A1 Mar. 13, 2008

(30) Foreign Application Priority Data
Sep. 8, 2006 (KR) .................. 10-2006-0086826

(51) Int. Cl.
*H01L 21/00* (2006.01)
(52) U.S. Cl. .................. 438/622; 438/625; 438/627
(58) Field of Classification Search .................. 438/622, 438/625, 627, 652
See application file for complete search history.

(56) References Cited

U.S. PATENT DOCUMENTS

| | | | | |
|---|---|---|---|---|
| 5,169,803 A | * | 12/1992 | Miyakawa | 438/625 |
| 5,278,449 A | * | 1/1994 | Miyakawa | 257/751 |
| 5,300,814 A | * | 4/1994 | Matsumoto et al. | 257/758 |
| 5,355,020 A | * | 10/1994 | Lee et al. | 257/741 |
| 5,627,102 A | * | 5/1997 | Shinriki et al. | 438/648 |
| 5,646,063 A | * | 7/1997 | Mehta et al. | 438/425 |
| 5,702,977 A | * | 12/1997 | Jang et al. | 216/38 |
| 5,728,621 A | * | 3/1998 | Zheng et al. | 438/427 |
| 5,817,568 A | * | 10/1998 | Chao | 438/427 |
| 5,843,842 A | * | 12/1998 | Lee et al. | 438/688 |
| 5,880,007 A | * | 3/1999 | Varian et al. | 438/427 |
| 5,928,959 A | * | 7/1999 | Huckels et al. | 438/691 |
| 5,962,084 A | * | 10/1999 | Miyamoto et al. | 427/576 |

FOREIGN PATENT DOCUMENTS

| | | |
|---|---|---|
| KR | 1019930003841 B1 | 5/1993 |
| KR | 1019950000108 B1 | 1/1995 |
| KR | 1019970003896 B1 | 3/1997 |
| KR | 1020030002787 A | 1/2003 |
| KR | 1020060071231 A | 6/2006 |

* cited by examiner

*Primary Examiner*—Laura M Menz
(74) *Attorney, Agent, or Firm*—Marshall, Gerstein & Borun LLP

(57) ABSTRACT

A first conductive layer is formed over a substrate in which contact holes are formed in an interlayer insulating layer. The first conductive layer is melted by an annealing process, thus coating the lower sidewalls of the contact holes and partially filling the contact holes. A second conductive layer is deposited with a method having selectivity with respect to the same material as the first conductive layer, thus fully filling the contact holes. A metal line is formed on the second conductive layer. The contact holes are completely filled with a conductive material and the load of a CMP process can be alleviated. Accordingly, the electrical characteristics of a device can be improved, process reliability can be improved, and process repeatablity can be improved.

10 Claims, 3 Drawing Sheets

METHOD OF FORMING A METAL LINE OF A SEMICONDUCTOR DEVICE

BACKGROUND OF THE INVENTION

The present invention relates to semiconductor devices and, more particularly, to a method of forming a metal line of a semiconductor device employing a damascene scheme.

In recent years, a damascene scheme has been employed to form metal lines in semiconductor devices. The damascene metal line formation process includes forming a damascene pattern (such as a trench or contact hole) in an insulating layer, and then filling the damascene pattern with a metal material.

When a plug is formed using the damascene scheme, tungsten (W) is generally used as a conductive material. In the prior art, in the case where a tungsten plug is formed, it is difficult to lower the capacitance due to the narrow space between the metal lines present in a semiconductor device as the level of integration increases.

To solve the capacitance problem, there was a proposed method of reducing the capacitance value by decreasing the thickness of the conductive layer in an interconnection process. However, the resistance value is increased due to the thinned conductive layer.

To minimize the increase in resistance while lowering the capacitance, the interconnection process must be performed using a material having a low resistivity. Research has been performed regarding the interconnection process.

Materials having a low resistivity include copper (Cu), aluminum (Al) used as a wire material, and so on. The materials have been evaluated as materials to replace tungsten. Tungsten ha a resistivity of 6 $\mu\Omega \cdot cm$ to 15 $\mu\Omega \cdot cm$, which is higher than the resistivity of aluminum: 2.7 $\mu\Omega \cdot cm$ to 3.0 $\mu\Omega \cdot cm$. Accordingly, it is possible to maintain a low resistance while simultaneously lowering the height of the metal layer.

Although the plug or the metal line is formed using a conductive material having a low resistivity, the width of the plug or the metal line is decreased, thereby making it difficult to fill the contact hole with the conductive material. In particular, when aluminum is used to form the plug, the contact hole is not fully filled with aluminum since the gap-fill characteristics of aluminum are poor.

Chemical vapor deposition (CVD) is used to solve this problem. However, it is difficult to perform chemical mechanical polishing (CMP) for the shortage between lines. Furthermore, the properties of aluminum may be changed due to a thermal process carried out in a subsequent step because aluminum has a low melting point. Thus, there is a need for a method capable of solving these problems.

BRIEF SUMMARY OF THE INVENTION

An embodiment of the present invention is directed to a method of manufacturing a semiconductor device, which method can improve the electrical characteristics of the device, can improve process reliability, and can improve process repeatability. When a first conductive layer is formed over a substrate in which contact holes are formed in an interlayer insulating layer, the first conductive layer is melted by an annealing process, thus filling a part of the contact holes, a second conductive layer is deposited by a deposition method having selectivity for the same material, the contact holes are fully filled, a metal line is formed thereon, the contact holes are fully filled with a conductive material, and the load of a CMP process is alleviated.

In one embodiment, a method of forming a metal line of a semiconductor device includes the steps of forming a first interlayer insulating layer over a semiconductor substrate, and etching a specific region to form contact holes; forming a first conductive layer on the entire surface; performing an annealing process so that the first conductive layer flows downward into the contact holes, thus coating the lower sidewalls and bottom region of the contact holes with the first conductive layer; filling a second conductive layer in the contact holes; forming a third conductive layer on the resulting surface including the second conductive layer; and patterning the third conductive layer to form a metal line.

DESCRIPTION OF SPECIFIC EMBODIMENTS

A specific embodiment according to the present disclosure is described with reference to the accompanying drawings.

Figure 1A:
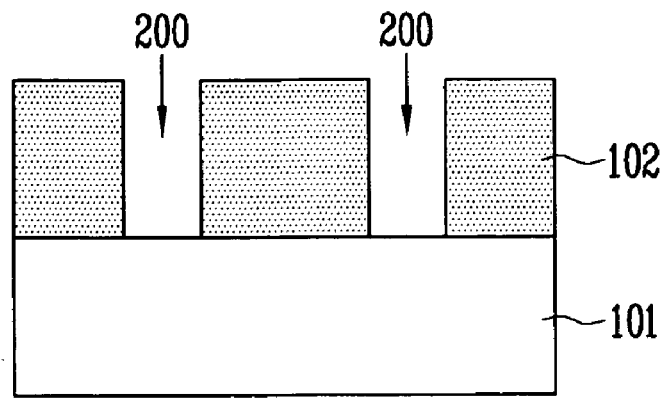
FIGS. 1A to 1I are cross-sectional views illustrating a method of forming a metal line of a semiconductor device according to an embodiment of the present invention.

Referring to FIG. 1A, a first interlayer insulating layer 102 is formed on a semiconductor substrate 101. The first interlayer insulating layer 102 is formed using an oxide layer. A mask layer (not shown) and a photoresist film (not shown) for forming contacts are formed on the first interlayer insulating layer 102.

Only the contact region is removed by photo and etch processes, thus forming a photoresist film pattern (not shown). The first interlayer insulating layer 102 is etched using the photoresist film pattern (not shown) so that the semiconductor substrate 101 is exposed, thereby forming contact holes 200 having sidewalls and a bottom region.

Figure 1B:
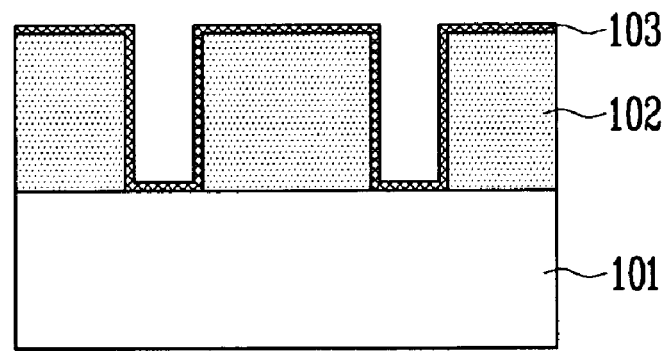

Referring to FIG. 1B, a liner metal layer 103 is thinly formed on the entire surface along a top surface. The liner metal layer 103 can be formed using titanium/titanium nitride (Ti/TiN).

Figure 1C:
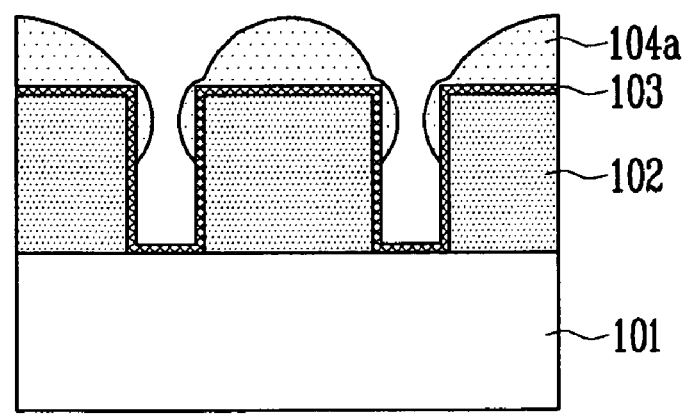

Referring to FIG. 1C, a first conductive layer 104a is formed on at least a portion of the resulting surface by CVD. The first conductive layer is formed from aluminum (Al). However, the first conductive layer 104a does not completely fill the contact holes 200 because of the narrow width of the contact holes 200. Thus, the first conductive layer 104a is mainly formed above the top surface of the first interlayer insulating layer 102 and along the sidewalls of the contact holes 200. The first conductive layer 104a can have a thickness of 150 Å to 200 Å. As illustrated in FIG. 1C, the first conductive layer 104a is formed on the liner metal layer 103, both above the top surface of the first interlayer insulating layer 102 and along the sidewalls of the contact holes 200.

Figure 1D:
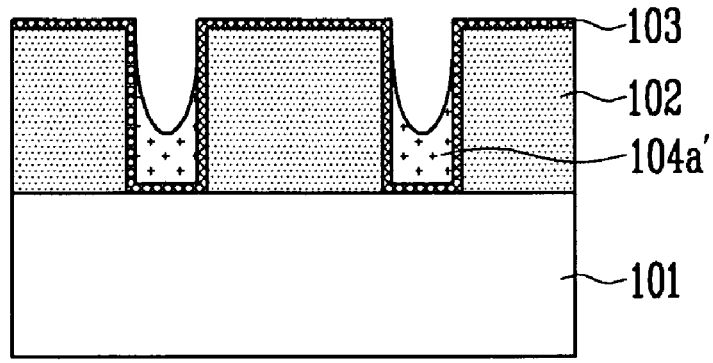

Referring to FIG. 1D, an annealing process is performed. The first conductive layer 104a flows downward into the contact holes 200 when melted by the annealing process, thus coating the lower sidewalls and the bottom region of the contact holes 200, thereby forming a first annealed conductive layer 104a'. The annealing process is performed using at a temperature of 430° C. to 450° C. when Al is used as the first conductive layer 104a, although the temperature can differ depending on the conductive layer material. The first annealed conductive layer 104a' has a shape whose edges are high and whose center is low within the contact holes 200 due to friction with the liner metal layer 103.

When the first conductive layer 104a flows into the contact holes 200, the portion of the first conductive layer 104a deposited in the over-hang region of the contact holes 200 disappears, and remains only on the lower side of the contact holes 200. Accordingly, the aspect ratio of the contact holes 200 can be lowered.

Furthermore, a residual portion of the first conductive layer 104a (not shown) can partially remain on the liner metal layer 103 without flowing into the contact holes 200. In this case, an etch process for removing the residual portion of first conductive layer 104a can be performed.

Figure 1E:
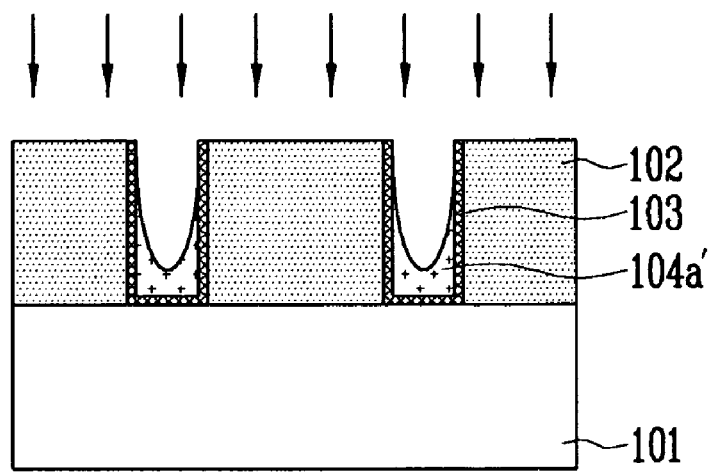

Referring to FIG. 1E, the liner metal layer 103 on the top surface of the first interlayer insulating layer 102 is removed by an etch process, exposing the top surface of the first interlayer insulating layer 102. The liner metal layer 103 is formed from a conductive material. Thus, if metal lines are formed in a subsequent process, the metal lines are electrically connected by the liner metal layer 103. Therefore, it is preferred that the liner metal layer 103 on the first interlayer insulating layer 102 be removed before the metal lines are formed. As shown in FIG. 1E, a portion of the first annealed conductive layer 104a' is removed by the etch process of the liner metal layer 103.

Figure 1F:
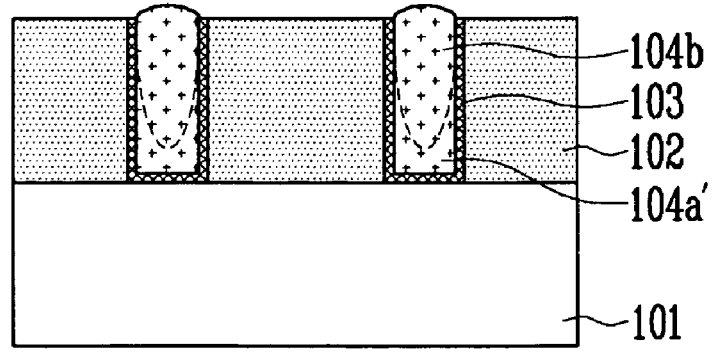

Referring to FIG. 1F, the contact holes are fully filled with a second conductive layer 104b. At this time, if the second conductive layer 104b is formed by employing selective CVD, the second conductive layer 104b is selectively formed only on the first annealed conductive layer 104a' having the same material, so that the contact holes can be fully filled with the second conductive layer 104b.

Thus, the first annealed conductive layer 104a' serves as a seed layer for the second conductive layer 104b. The first annealed and second conductive layers 104a' and 104b serve as contact plugs. This method compensates for poor gap-filling characteristics, based on which it is difficult to completely fill the contact holes 200 with conductive layers formed by physical vapor deposition (PVD). The second conductive layer 104b can have a thickness of about 100 Å to 200 Å.

Meanwhile, a residual second conductive layer (not shown) can also be formed on the first interlayer insulating layer 102. Thus, after the contact holes are filled with the second conductive layer 104b, the residual second conductive layer formed on the first interlayer insulating layer 102 can be removed by CMP. The residual second conductive layer is formed on the first interlayer insulating layer 102 very thinly, if at all. Accordingly, there is no difficulty in performing the CMP process.

Figure 1G:
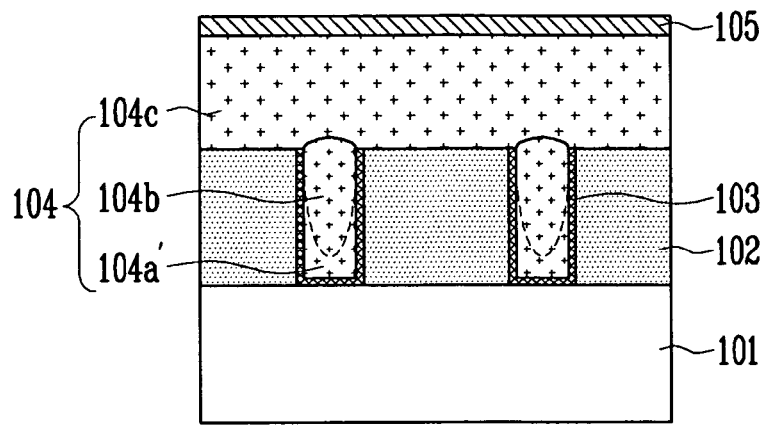

Referring to FIG. 1G, a third conductive layer 104c is formed on the entire surface including the second conductive layer 104b and the first insulating layer 102. As described below, the first annealed, the second, and the third conductive layers 104a', 104b, and 104c collectively form a metal line 104. The third conductive layer 104c can be formed using aluminum by PVD. In the case where the third conductive layer 104c is formed by PVD, the third conductive layer 104c is formed using a hot deposition step instead of a cool deposition step. The hot deposition step can be performed at a temperature of 430° C. to 450° C.

An anti-reflection layer 105 is formed on the metal line 104. The anti-reflection layer 105 is formed from Ti/TiN, and it can be formed in-situ in the same equipment in which the third conductive layer 104c is formed.

Figure 1H:
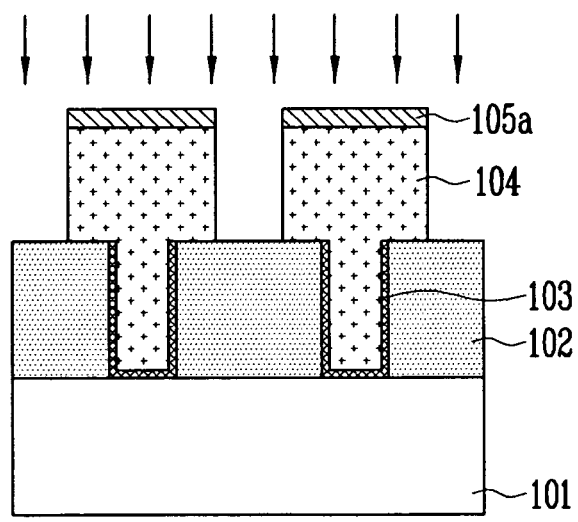

Referring to FIG. 1H, a photoresist (not shown) for forming lines is coated on the anti-reflection layer 105. An exposure process is then performed. The photoresist in the remaining portions other than the portion in which the lines are formed is removed through an exposure process, thus forming a photoresist pattern (not shown).

An etch process using the photoresist pattern as an etch mask is performed to etch the anti-reflection layer 105a and the third conductive layer 104c. Accordingly, the metal line 104 is formed.

Figure 1I:
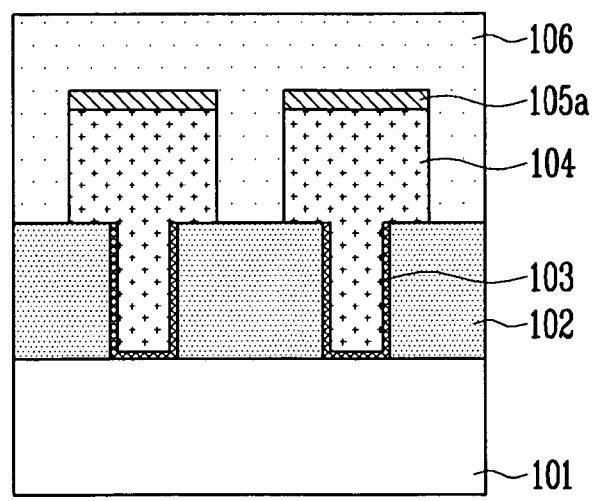

Referring to FIG. 1I, a second interlayer insulating layer 106 is formed on the entire resulting surface, including the first interlayer insulating layer 102, the sides of the metal line 104, and the anti-reflection layer 105a. The second interlayer insulating layer 106 can be formed using an oxide layer.

As described above, the present invention has the following advantages.

First, the gap-filling step can be performed easily even with a narrow line width.

Second, the Ti/TiN layer formed as the liner metal layer and the anti-reflection layer remains only in the final semiconductor device on the metal line 104. Accordingly, the amount of the Ti/TiN layer can be decreased. It is thus possible to prohibit the formation of $TiAl_3$, which hinders the resistance characteristic, and thus secures a low resistivity value.

Third, the resistance between boundary surfaces can be reduced.

Fourth, although the line width is decreased, an increase in the resistance can be prevented. Accordingly, an increase in RC delay can be prevented, a reduction in the operating speed can be prevented, and power consumption can be reduced.

The above embodiments of the present invention are illustrative and not limiting. Various alternatives and equivalents are possible. Other additions, subtractions, or modifications that are obvious in view of the present disclosure are intended to fall within the scope of the appended claims.

What is claimed is:

1. A method of forming a metal line of a semiconductor device, comprising the steps of:
    forming a first interlayer insulating layer over a semiconductor substrate, and etching a specific region of the first interlayer insulating layer to form contact holes having sidewalls and a bottom region;
    forming a liner metal layer on surface of the first interlayer insulating layer and the contact holes;
    forming a first conductive layer on the surface of the first interlayer insulating layer including the contact holes;
    performing an annealing process so that the first conductive layer flows downward into the contact holes, thus coating the lower sidewalls and bottom region of the contact holes with the first conductive layer, thereby forming a first annealed conductive layer;
    removing the liner metal layer formed on the first interlayer insulating layer;
    filling a second conductive layer in the contact holes on the first annealed conductive layer;
    forming a third conductive layer on the surface of the first interlayer insulating layer and the second conductive layer; and
    patterning the third conductive layer to form a metal line.

2. The method of claim 1, wherein the liner metal layer is formed from Ti/TiN.

3. The method of claim 1, wherein the first, second, and third conductive layers are formed of aluminum (Al).

4. The method of claim 1, wherein the first conductive layer has a thickness of 150 Å to 200 Å, and is formed by chemical vapor deposition (CVD).

5. The method of claim 1, wherein the annealing process is performed at a temperature of 430° C. to 450° C.

6. The method of claim 1, wherein the second conductive layer has a thickness of 100 Å to 200 Å and is formed by selective chemical vapor deposition (CVD).

7. The method of claim 1, wherein the third conductive layer is formed by a physical vapor deposition (PVD).

8. The method of claim 1, wherein step of forming a third conductive layer further comprises forming an anti-reflection layer on the third conductive layer.

9. The method of claim 8, wherein the anti-reflection layer is formed from Ti/TiN.

10. The method of claim 8, wherein the anti-reflection layer is formed in-situ in the same equipment in which the third conductive layer is formed.

* * * * *